(12) United States Patent
Semmes (10) Patent No.: US 11,137,431 B1
(45) Date of Patent: Oct. 5, 2021

(54) APPARATUSES AND METHODS FOR STUDYING POSSIBLE EFFECTS OF DARK MATTER

(71) Applicant: Jeffery T. Semmes, Monroe, LA (US)

(72) Inventor: Jeffery T. Semmes, Monroe, LA (US)

( * ) Notice: Subject to any disclaimer, the term of this patent is extended or adjusted under 35 U.S.C. 154(b) by 1168 days.

(21) Appl. No.: 15/594,767

(22) Filed: May 15, 2017

(51) Int. Cl.
*G01R 29/08* (2006.01)
*H01L 25/16* (2006.01)

(52) U.S. Cl.
CPC ........ *G01R 29/0878* (2013.01); *H01L 25/165* (2013.01)

(58) Field of Classification Search
CPC ..... H04B 13/00; H04L 63/14; H04L 63/1408; G06F 16/951; G01R 29/0878
See application file for complete search history.

(56) References Cited

U.S. PATENT DOCUMENTS

| | | | | |
|---|---|---|---|---|
| 3,689,842 A * | 9/1972 | Meed | ........................ | G01S 1/02 342/38 |
| 5,258,763 A | 11/1993 | Riebman | | |
| 7,787,840 B1 * | 8/2010 | Rzyski | ..................... | H04B 1/24 455/130 |
| 8,669,917 B1 * | 3/2014 | Wagner | .................. | H04B 13/00 343/905 |
| 9,196,953 B1 * | 11/2015 | Kim | ......................... | H01Q 1/50 |
| 2003/0179123 A1 * | 9/2003 | DeVilbiss | ............... | H03M 1/60 341/157 |
| 2004/0027031 A1 * | 2/2004 | Beckwith | .............. | G01T 1/1606 310/311 |
| 2005/0156681 A1 * | 7/2005 | Takinami | ............... | H03K 3/354 331/117 R |
| 2012/0212375 A1 * | 8/2012 | Depree, IV | ........ | H01Q 15/0086 343/700 MS |
| 2015/0062972 A1 * | 3/2015 | Yang | .................. | H02M 3/33592 363/21.01 |
| 2017/0019416 A1 * | 1/2017 | Balcik | ..................... | H04L 67/42 |
| 2018/0267157 A1 * | 9/2018 | Guruprasad | ............ | G01S 11/14 |

* cited by examiner

*Primary Examiner* — Huy Q Phan
*Assistant Examiner* — David B Frederiksen
(74) *Attorney, Agent, or Firm* — R. Keith Harrison (57) ABSTRACT

Apparatuses for studying possible physical effects of dark matter may include an electronic oscillator. A power source may be in electrical communication with the electronic oscillator. An antenna may be in series electrical communication with the electronic oscillator. A first diode may be in series electrical communication with the electronic oscillator and the antenna. A second diode may be in series electrical communication with the electronic oscillator and the antenna. The first diode and the second diode may ensure and restrict flow of electrical current in one direction only in the antenna. Methods for studying possible physical effects of dark matter are also disclosed.

20 Claims, 11 Drawing Sheets

APPARATUSES AND METHODS FOR STUDYING POSSIBLE EFFECTS OF DARK MATTER

FIELD

Illustrative embodiments of the disclosure generally relate to techniques and methods for studying the possible effects of non-Newtonian physical forces. More particularly, illustrative embodiments of the disclosure relate to apparatuses and methods for studying possible physical effects of dark matter.

BACKGROUND

The background description provided herein is solely for the purpose of generally presenting the context of the illustrative embodiments of the disclosure. Aspects of the background description are neither expressly nor impliedly admitted as prior art against the claimed subject matter.

For every action, there is an equal and oppositely directed reaction. If an object is moved or accelerated, then the force that accelerates it must also accelerate another object in the opposite direction. The center of mass of these two objects will not move despite their accelerations. Furthermore, it is an accepted fact that the energy of a closed system remains constant. This is known as the Law of Conservation of Energy. Take, for example, an object which oscillates about a fixed point. The object first moves in one direction, then slows down and stops. The object then begins moving in the opposite direction until it again slows and then stops. Energy is first imparted to the object to initiate the oscillation movement, and then dissipates from the object as it slows down.

In a spring-mass system, a mass is attached to a spring. As the mass moves away from a fixed end of the spring in response to a force, the momentum of the mass progressively deforms the spring. This deformation of the spring will eventually convert the kinetic energy of the moving mass into potential energy of the deformed spring. The force of the deformed spring will then accelerate the mass in the opposite direction as the potential energy of the deformed spring is converted into kinetic energy of the moving mass. As the spring reaches its contracted or un-deformed length, the mass will slow down and its kinetic energy will then again be converted into the potential energy of the deformed spring. Such a spring-mass system will allow the mass to oscillate about a fixed point. Friction, however, will eventually dissipate the energy of the system.

Dark matter is an unidentified type of matter which is distinct from dark energy, baryonic matter (ordinary matter), and neutrinos. The existence of dark matter would explain a number of otherwise puzzling astronomical observations. The term "dark matter" refers to the fact that it does not emit or interact with electromagnetic radiation such as light, and thus, is invisible to the entire electromagnetic spectrum. Although it has not been directly observed, the existence and properties of dark matter are inferred from its gravitational effects such as its effects on the motions of visible matter and gravitational lensing and its influence on the universe's large-scale structure and galaxies, and on its effects in the cosmic microwave background.

Illustrative embodiments of the disclosure are generally directed to apparatuses and methods for studying possible physical effects of dark matter. In a first experiment, an apparatus of the present disclosure may be supported on a buoyant float in a container of still water for a period of time. The apparatus may be periodically turned on, or activated, and then subjected to an initial directional force. Responsively, the apparatus may oscillate about a fixed point without application of apparent restorative force or additional energy. Oscillation of the apparatus will eventually dissipate through friction. There is no apparent restorative force to oppose the motion of the apparatus or to store and re-release the kinetic energy of the apparatus.

In a second experiment, two apparatuses of the present disclosure, each on its own float in its own container of still water, may be placed side-by-side. Sudden movement of one apparatus may cause movement of the other apparatus in the same direction. Both apparatuses will then oscillate until stopped by friction. In a third experiment, two apparatuses may be arranged at right angles to each other on a float in a container of still water. Sequential activation of the apparatuses may cause the float to move directionally on the water.

It is postulated that the results of these experiments may be due to the effects of dark matter on the apparatuses. In the event that the apparatuses are accumulating dark matter during the time period in which they remain activated, then the dark matter may subsequently exert gravitational attraction on the apparatuses and thereby serve the same role as the spring in the spring-mass system example which was described above. Dark matter may be ejected from the apparatuses, causing the apparatuses to move in the opposite direction. In some applications, movement of the apparatuses may cause the dark matter which has accumulated thereon to move also, and this result may be responsible for the motion of the second apparatus in the side-by-side experiment. Movement of the first apparatus may cause its accumulated dark matter to move, thereby causing the dark matter of the second apparatus and the second apparatus itself to move. In the third experiment, the first apparatus, when activated, may accumulate dark matter. When the second apparatus is subsequently activated, some of the dark matter may be ejected from the first apparatus or both apparatuses, causing movement of the float on which the first apparatus and the second apparatus are supported.

SUMMARY OF THE INVENTION

Illustrative embodiments of the disclosure are generally directed to apparatuses for studying possible effects of dark matter. An illustrative embodiment of the apparatuses includes an electronic oscillator. A power source may be in electrical communication with the electronic oscillator. An antenna may be in series electrical communication with the electronic oscillator. A first diode may be in series electrical communication with the electronic oscillator and the antenna. A second diode may be in series electrical communication with the electronic oscillator and the antenna. The first diode and the second diode may ensure and restrict flow of electrical current in one direction only in the antenna.

In some embodiments, an illustrative embodiment of the apparatuses may include an electronic oscillator having a Field Effect Transistor component and a source resistor/capacitor component. A power source may be in electrical communication with the Field Effect Transistor component and the source resistor/capacitor component of the electronic oscillator. An antenna may be provided in series electrical communication with and between the Field Effect Transistor component and the source/resistor component. A first diode may be provided in series electrical communication with and between the Field Effect Transistor component of the electronic oscillator and the antenna. A second diode may be provided in series electrical communication with and between the source resistor/capacitor component of the electronic oscillator and the antenna. The first diode and the second diode may ensure and restrict flow of electrical current in one direction only in the antenna.

Illustrative embodiments of the disclosure are further generally directed to methods for studying possible physical effects of dark matter. An illustrative embodiment of the methods may include rendering mobile at least one apparatus for studying possible effects of dark matter, the at least one apparatus including an electronic oscillator having a Field Effect Transistor component and a source resistor/capacitor component; a power source in electrical communication with the Field Effect Transistor component and the source resistor/capacitor component of the electronic oscillator; an antenna in series electrical communication with and between the Field Effect Transistor component and the source/resistor component; a first diode in series electrical communication with and between the Field Effect Transistor component of the electronic oscillator and the antenna; a second diode in series electrical communication with and between the source resistor/capacitor component of the electronic oscillator and the antenna, the first diode and the second diode ensuring and restricting flow of electrical current in one direction only in the antenna; activating the apparatus; and observing, studying and analyzing movement of the apparatus.

BRIEF DESCRIPTION OF THE DRAWINGS

Illustrative embodiments of the disclosure will now be described, by way of example, with reference to the accompanying drawings, in which.

DETAILED DESCRIPTION

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the claims. Furthermore, there is no intention to be bound by any expressed or implied theory presented in the preceding technical field, background, brief summary or the following detailed description. As used herein, relative terms such as "upper" and "lower" are intended to be used in an illustrative and not a limiting sense. In some applications, therefore, those elements which are identified as "upper" may be located beneath those elements which are identified as "lower" in the following detailed description.

Referring initially to FIGS. 1-4 of the drawings, an illustrative embodiment of the apparatuses for studying the possible effects of dark matter, hereinafter apparatus, is generally indicated by reference numeral 1. The apparatus 1 may include an electronic oscillator 2. The electronic oscillator 2 may be a tuned drain, un-tuned gate type oscillator and may include a FET (Field Effect Transistor) component 2a and a source resistor/capacitor component 2b which are disposed in spaced-apart relationship to each other. An antenna 3 may be positioned in series electrical communication between the FET component 2a and the source resistor/capacitor component 2b of the electronic oscillator 2. A first diode 4a may be provided between and in series electrical communication with the antenna 3 and the FET component 2a of the electronic oscillator 2. A second diode 4b may be provided between and in series electrical communication with the antenna 3 and the source resistor/capacitor component 2b of the electronic oscillator 2.

At least one electric power source 7 may be disposed in electrical communication with the FET component 2a of the electronic oscillator 2 through a power source contact 24. The power source 7 may include, for example and without limitation, at least one battery, at least one solar panel, at least one electrical outlet, or any combination thereof. At least one conductive reservoir 5 may be disposed in electrical communication with the source resistor/capacitor component 2b of the electronic oscillator 2 through a reservoir contact 26. A switch 6 may be disposed in electrical communication with the power source 7 through a first switch contact 28 and with the conductive reservoir 5 through a second switch contact 30.

Figure 1:
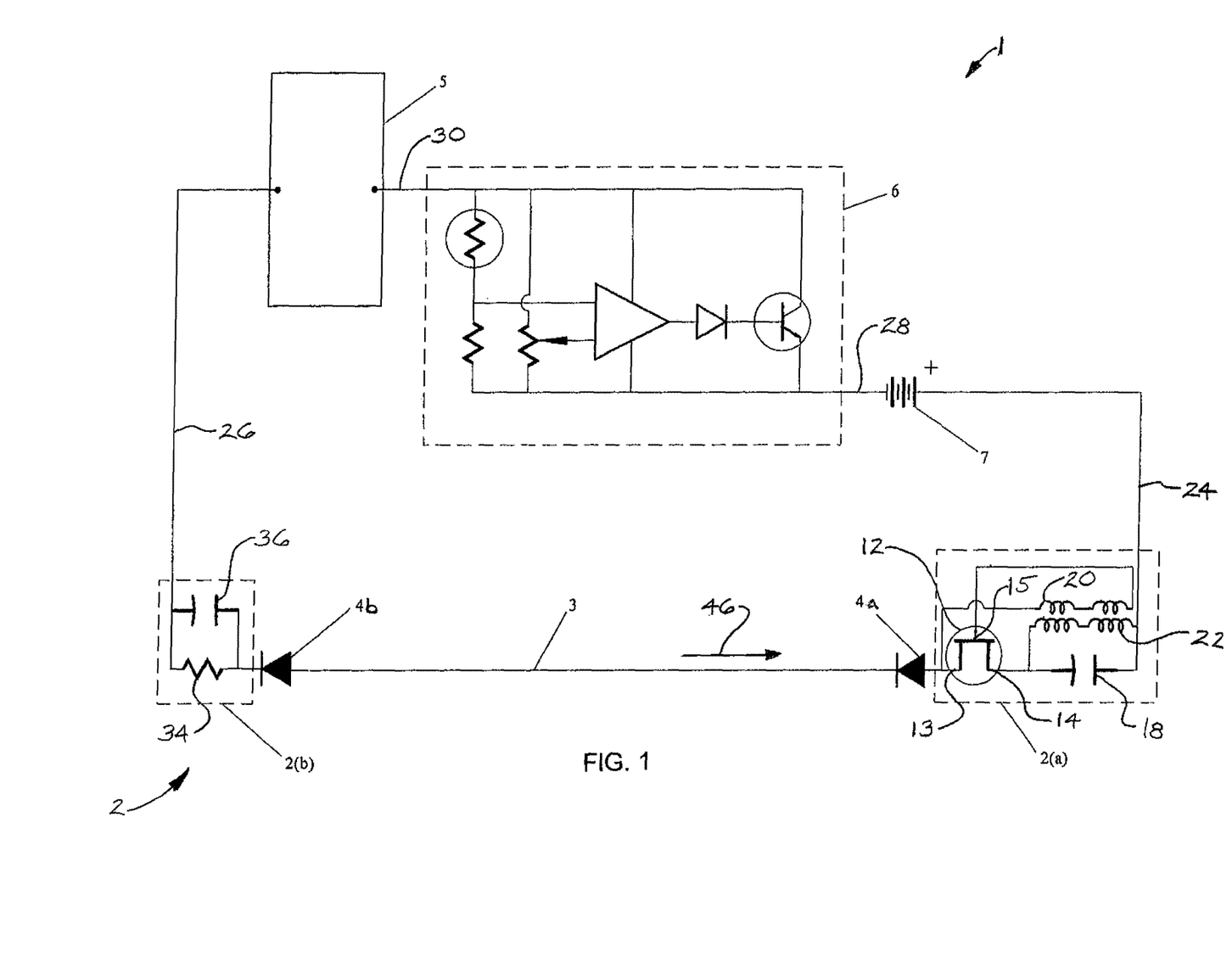
FIG. 1 is an electrical schematic block diagram of an illustrative embodiment of the apparatuses for studying possible effects of dark matter.

The FET component 2a of the electronic oscillator 2 may include an FET (Field Effect Transistor) 12 having a source 13, a drain 14 and a gate 15. The drain 13 of the FET 12 may be disposed in series electrical communication with the first diode 4a. A drain capacitor 18 may be disposed in series electrical communication with the drain 14 of the FET 12 and in electrical communication with the power source 7 through the power source contact 24. A first coil 20 may be disposed at one end in electrical communication with and between the source 13 of the FET 12 and the first diode 4a and at the other end in electrical communication with the gate 15 of the FET 12. A second coil 22 may be disposed at one end in electrical communication with and between the drain 14 of the FET 12 and the drain capacitor 18 and at the other end in electrical communication with and between the power source contact 24 and the drain capacitor 18.

The first coil 20 may form the secondary winding and the second coil 22 may form the primary winding of a transformer. A first end of the secondary winding 20 may be connected to ground, or in this case near the first diode 4a. A second end of the secondary winding 20 may be connected to the gate 15 of the FET 12. A first end of the primary winding 22 may be connected to the drain 14 of the FET 12. A second end of the primary winding 22 may be connected to a positive voltage, or in this case, the power source contact 24. The primary winding 22 may be in parallel with the drain capacitor 18.

It will be recognized and understood that the electronic oscillator 2 which was heretofore described serves as a non-limiting example of an electronic oscillator which can be used for the purpose of implementing the apparatus 1. Any type of electronic oscillator which is capable of generating and transmitting a radio-frequency (RF) signal to the antenna 3 and the first diode 4a and the second diode 4b may be suitable for the purpose.

The source resistor/capacitor component 2b of the electronic oscillator 2 may include a source resistor 34 disposed in series electrical communication with the second diode 4b and with the conductive reservoir 5. A source capacitor 36 may be disposed in parallel electrical communication with the source resistor 34.

Figure 2:
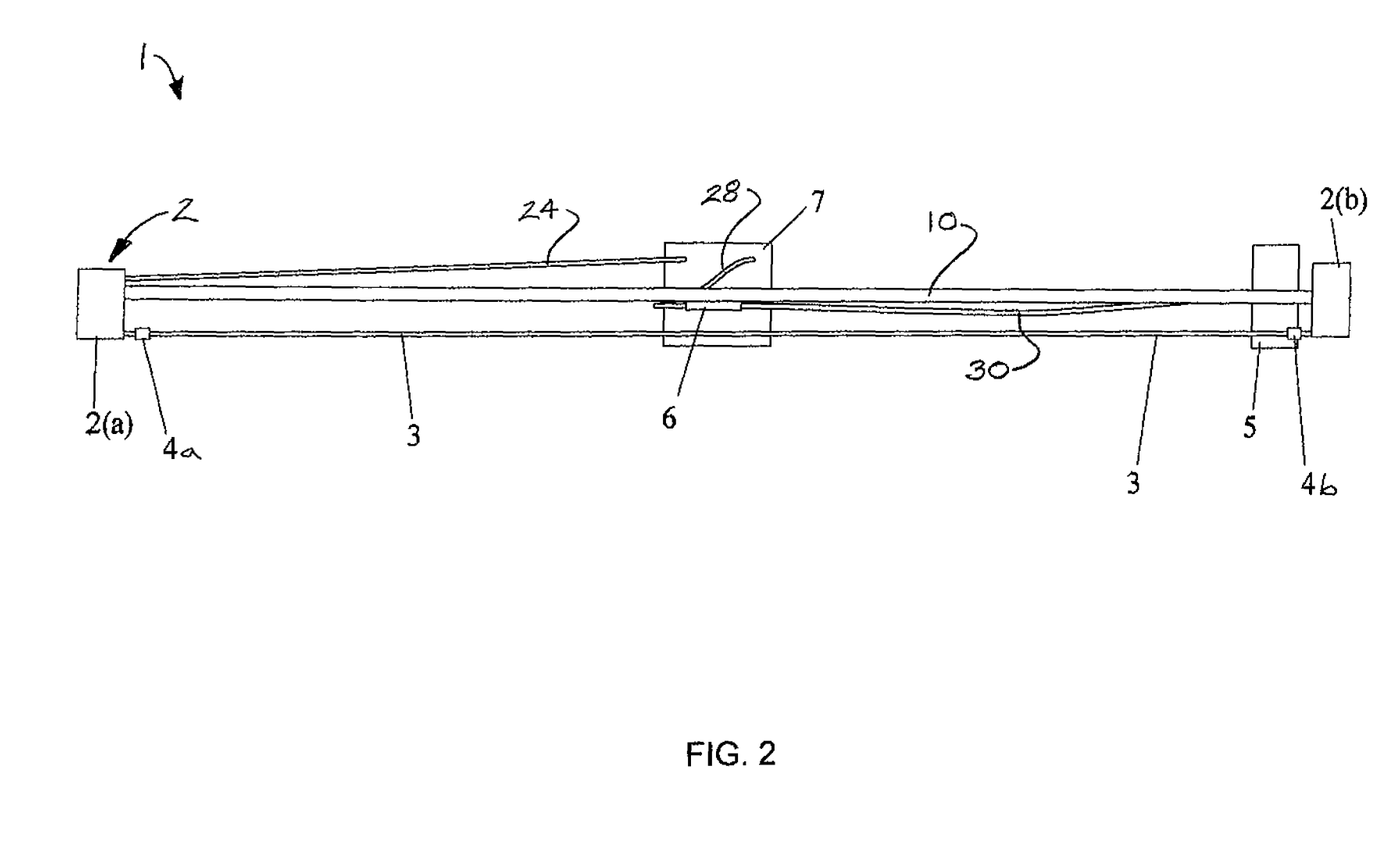
FIG. 2 is a top view of the illustrative apparatus.
Figure 3:
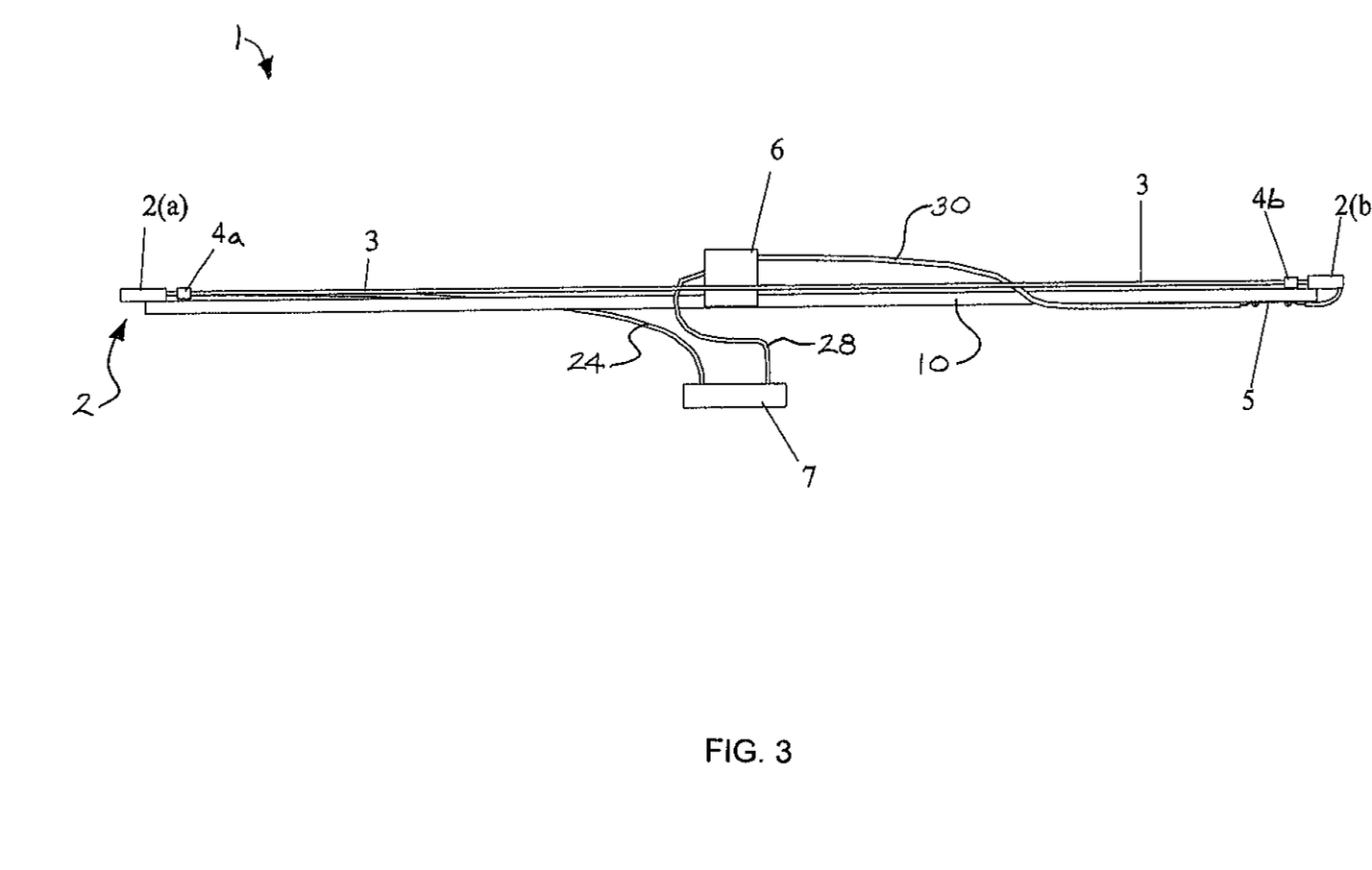
FIG. 3 is a side view of the illustrative apparatus.
Figure 4:
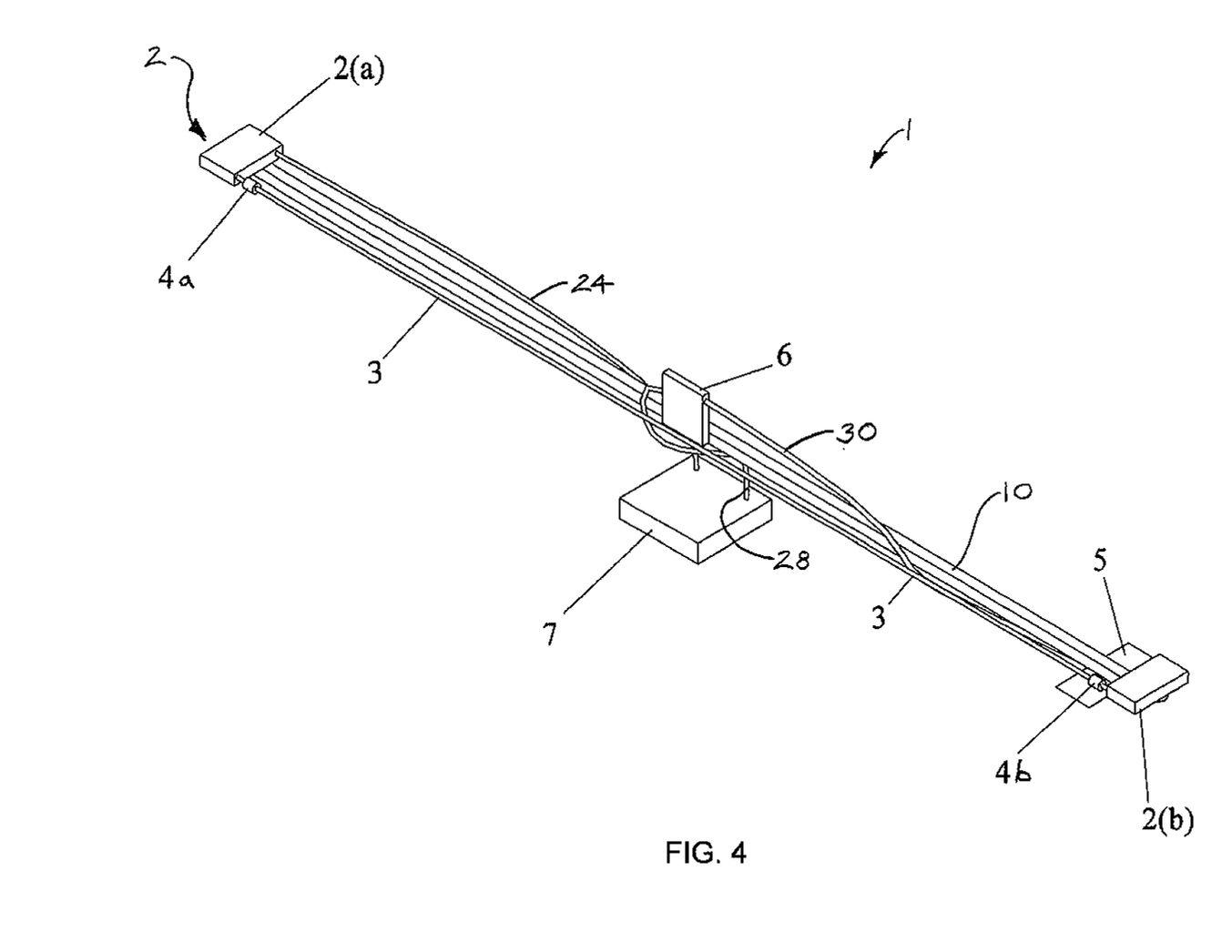
FIG. 4 is a perspective view of the illustrative apparatus.

The first diode 4a and the second diode 4b may be oriented to allow only a direct electrical current 46 through the antenna 3 with the electrons flowing from the source resistor 34 and the source capacitor 36 of the source resistor/capacitor component 2b to the FET transistor 12 of the FET component 2a of the electronic oscillator 2. Any fluctuation in the electrical current 46 can only take the form of an increase or decrease in that direct electrical current 46. The electrical current 46 in the antenna 3 cannot reverse direction. Typically, for radio communication purposes, an antenna is not a part of a closed circuit; therefore, the direction of the current in the antenna must alternate. Since the apparatus 1 is a closed circuit with the electronic oscillator 2, the antenna 3, the first diode 4a, the second diode 4b, the conductive reservoir 5, the switch 6 and the power source 7 wired in series, it is necessary to suppress any oscillations in any part of that circuit that is not in the antenna 3. Otherwise, any signal from the antenna 3 would be canceled since the return leg of that circuit would be broadcasting a signal which is 180 degrees out-of-phase with the signal broadcast by the antenna 3. To produce this effect, the conductive reservoir 5 may be included in the circuit between the power source 7 and the source resistor/capacitor component 2b of the electronic oscillator 2. As illustrated in FIGS. 2-4, the conductive reservoir 5 may be spatially located as close as possible to the source resistor/capacitor component 2b of the electronic oscillator 2. If the power source 7 is located near the drain 14 of the FET 12 in the FET component 2a of the electronic oscillator 2, then it may serve to suppress any oscillations from the drain 14. Otherwise, in alternative embodiments, a second conductive reservoir 5 may be provided immediately adjacent to the drain 14 of the FET 12. Such placement of the conductive reservoir 5 may enhance elimination of any oscillations in the electric current 46 in the non-antenna part of the circuit and prevent any interference with the signal which is broadcast by the antenna 3. The switch 6 may be included to facilitate selective activation of the apparatus 1 without disturbing and interfering with any observations during testing. In some embodiments, the switch 6 may be a light-activated switch. In other embodiments, other types of switches known by those skilled in the art may be used.

As illustrated in FIG. 1, upon activation of the switch 6, the power source 7 initiates the electrical current 46, which flows through the antenna 3. The first diode 4a and the second diode 4b ensure that the electrical current 46 does not change direction in the antenna 3. Accordingly, rather than oscillating, the electrical current 46 changes acceleration in one direction only. By constructing the electronic oscillator 2 such that the oscillations of the electrical current 46 are very large compared to any steady current produced, the first diode 4a and the second diode 4b ensure that the jerk, or change in acceleration of the electrical current 46 will, for the most part, not change direction. It is postulated that the resulting jerk, or rate of change in acceleration of the electrical current 46 in the antenna 3, causes dark matter to accumulate around the antenna 3.

As illustrated in FIGS. 2-4, in some embodiments, the apparatus 1 may include an elongated apparatus frame 10. The FET component 2a and the source resistor/capacitor component 2b of the electronic oscillator 2 may be supported at respective ends of the apparatus frame 10. The conductive reservoir 5, the switch 6 and the power source 7 may be supported by the apparatus frame 10 between the FET component 2a and the source resistor/capacitor component 2b of the electronic oscillator 2.

Figure 5:
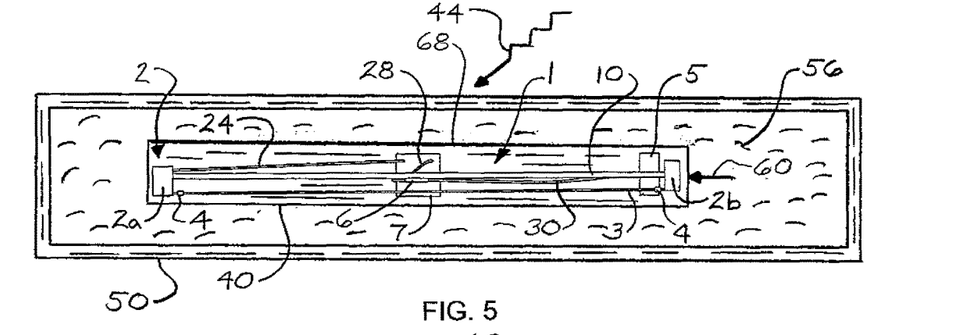
FIGS. 5-8 are top views of an illustrative apparatus on a float in a container of water, more particularly illustrating a first experiment in which the apparatus oscillates responsive to activation of and application of an initial directional force to the apparatus.
Figure 6:
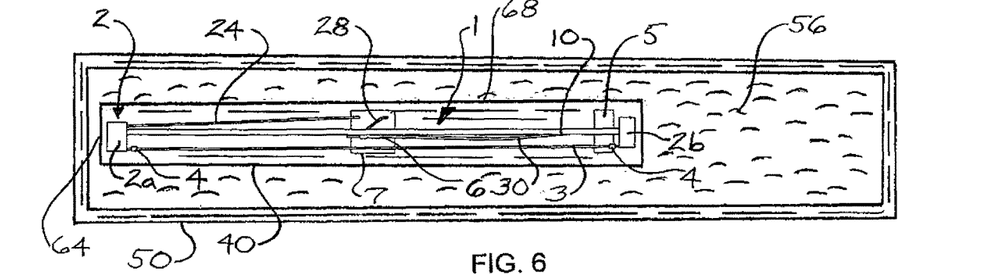
Figure 7:
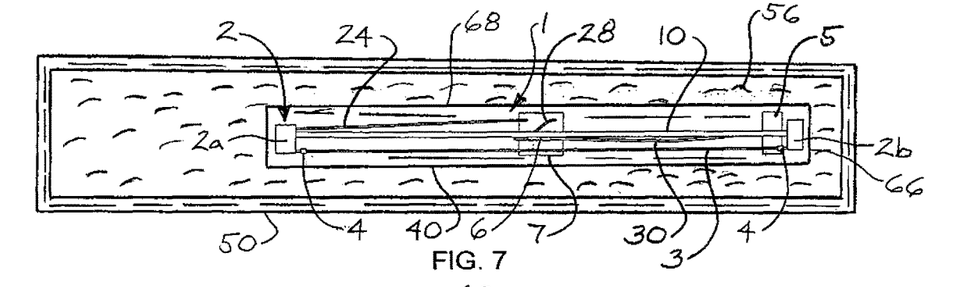
Figure 8:
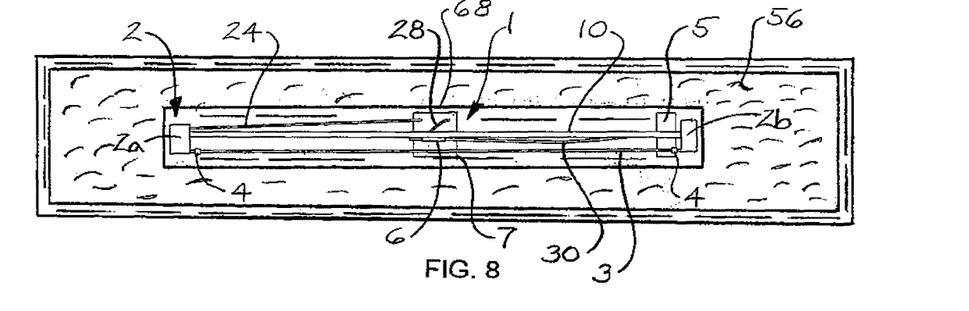

Referring next to FIGS. 5-8 of the drawings, in one application, a first experiment can be carried out in which the apparatus 1 is placed on a buoyant float 40, which may then be placed on water 56 in a container 50. The apparatus 1 may be periodically turned on, or activated, over a period of time (1-2 weeks, for example) such as by exposing the light-activated switch 6 to light 44 in some embodiments, as illustrated in FIG. 5. The float 40 may then be subjected to an initial directional force 60, as further illustrated in FIG. 5. Accordingly, as illustrated in FIG. 6, the apparatus 1 may first travel in the direction of the initial directional force 60 and then stop at a first position 64. The apparatus 1 may next travel in the opposite direction to a second position 66, as illustrated in FIG. 7. The apparatus 1 may stop at the second position 66 and then reverse direction and travel back to the original position, as illustrated in FIG. 8, or back to the first position 64 in FIG. 6, depending typically on the magnitude of the initial directional force 60 (FIG. 1) which was initially applied to the float 40. In the foregoing manner, the apparatus 1 may oscillate about a fixed point 68 with no apparent restorative force or addition of energy. This oscillating motion will eventually dissipate through friction. Throughout the oscillation, there is no apparent restorative force to oppose the motion of the apparatus or to store and re-release the kinetic energy of the apparatus 1. It is postulated that, upon and throughout activation of the apparatus 1, dark matter may accumulate around the antenna 3. The dark matter may exert a gravitational attraction on the apparatus 1, causing the apparatus 1 to oscillate between the first position 64 and the second position 66.

Figure 9:
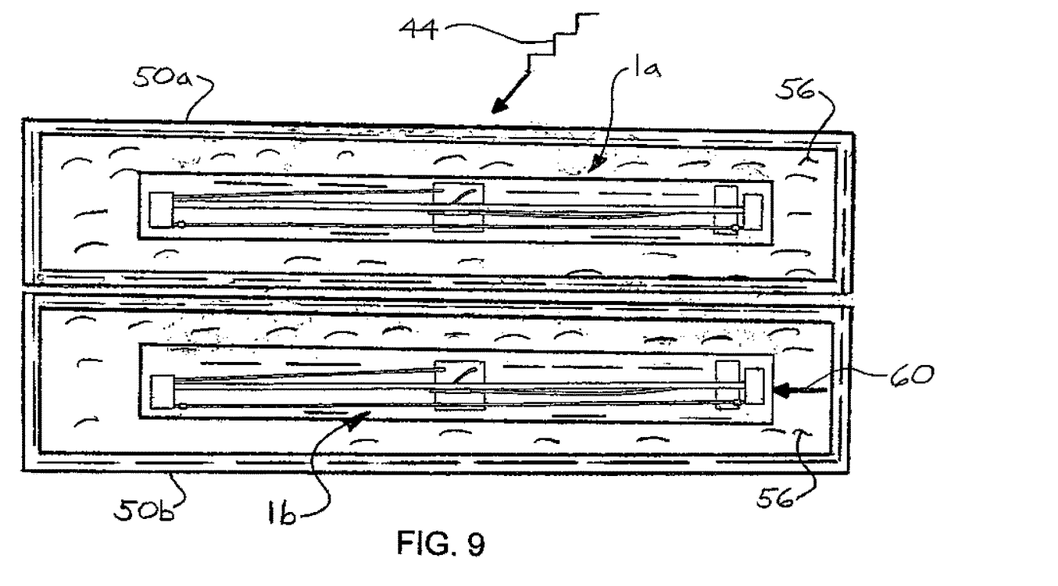
FIGS. 9-11 are top views of a pair of illustrative first and second apparatuses on a pair of floats in a pair of water-filled containers disposed side-by-side, more particularly illustrating a second experiment in which movement of the first apparatus causes movement of the second apparatus in the same direction, after which the first and second apparatuses oscillate until stopped by friction.
Figure 10:
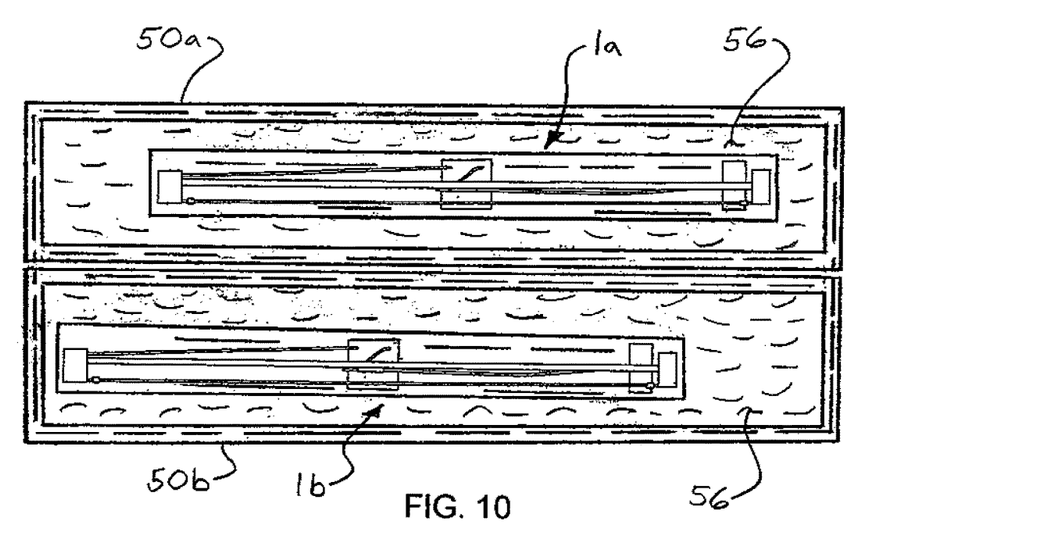
Figure 11:
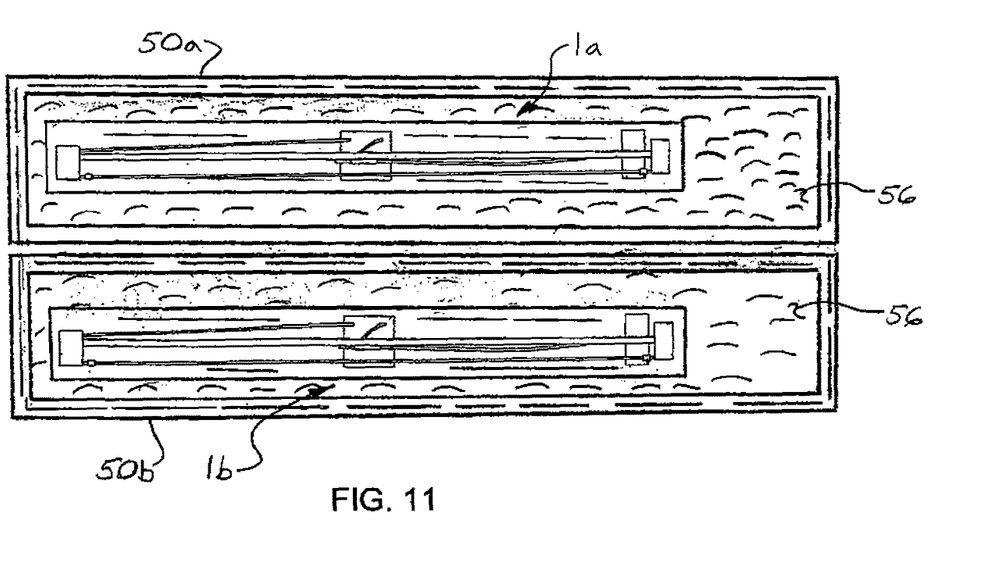

Referring next to FIGS. 9-11 of the drawings, in another application, a second experiment can be carried out in which a first apparatus 1a is placed on a buoyant float 40, which may then be placed on water 56 in a first container 50a. A second apparatus 1b may in like manner be placed on a buoyant float 40 on water 56 in a second container 50b. The first container 50a and the second container 50b may be placed in parallel electrical communication and side-by-side or adjacent relationship. The first apparatus 1a and the second apparatus 1b may be periodically turned on, or activated, over a period of time (1-2 weeks, for example) such as by exposing the switch 6 of each to light 44, as illustrated in FIG. 9. Sudden movement of the first apparatus 1a by application of an initial directional force 60 to the float 40 of the second apparatus 1b may cause movement of the first apparatus 1a in the same direction, as illustrated in FIGS. 10 and 11. Both the first apparatus 1a and the second apparatus 1b may then oscillate until stopped by friction. It is postulated that dark matter may accumulate around the antenna 3 of each of the first apparatus 1a and the second apparatus 1b upon activation and throughout the time in which the first apparatus 1a and the second apparatus 1b remain activated. Movement of the first apparatus 1a and the second apparatus 1b may cause the dark matter which has accumulated on the antenna 3 of each to move or become ejected from each, and this result may be responsible for the motion of the second apparatus 1b. Movement of the first apparatus 1a may cause its accumulated dark matter to move, thereby causing movement of the dark matter of the second apparatus 1b and the second apparatus 1b itself.

Figure 12:
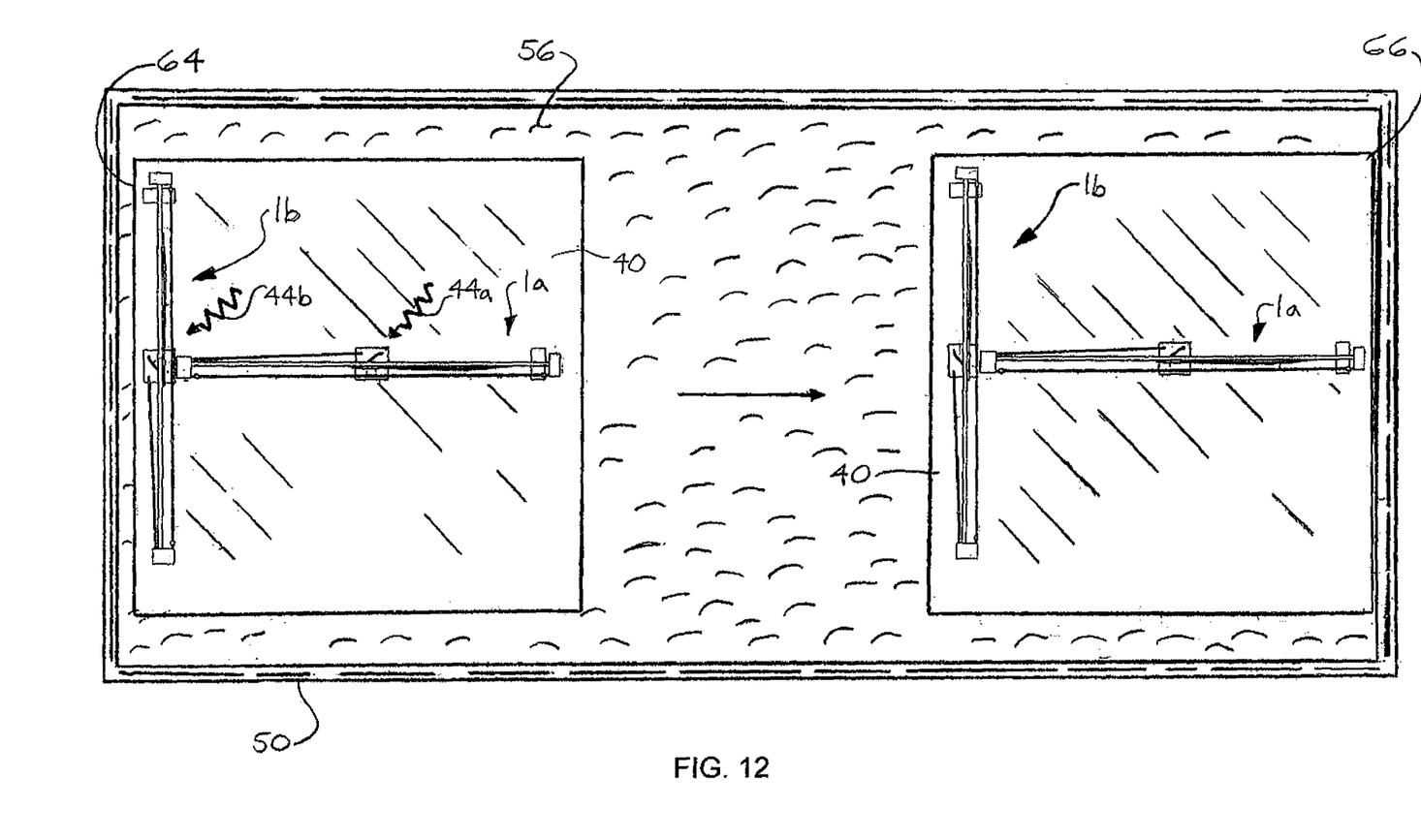
FIG. 12 is a top view of a pair of first and second apparatuses arranged at right angles to each other on a float in a container of still water, more particularly illustrating a third experiment in which sequential activation of the apparatuses causes the float to directionally move on the water.

Referring next to FIG. 12 of the drawings, in still another application, a third experiment can be carried out in which a first apparatus 1a and a second apparatus 1b are placed on a buoyant float 40 at a right angle to each other. The first apparatus 1a may be periodically turned on, or activated, over a period of time (1-2 weeks, for example) such as by exposing the switch 6 of the first apparatus 1a to light 44a. It is postulated that, upon activation, dark matter may accumulate around the antenna 3 of the first apparatus 1a. The second apparatus 1b may then be activated, such as by exposing the switch 6 of the second apparatus 1b to light 44b, and then suddenly inactivated or turned off. Accordingly, it is postulated that some of the dark matter may be ejected from the antenna 3 of the first apparatus 1a such that the float 40 may move on the water 56 in the direction which is opposite the direction in which the dark matter is ejected, from a first position 64 to a second position 66.

The apparatuses of the disclosure may be used to study the possible effects of dark matter in the generation of physical forces which can potentially be adapted for a variety of applications. The results of these studies may potentially be used to elucidate useful reactions which will move an apparatus or vehicle in a direction which is opposite the direction in which the dark matter is ejected. For example and without limitation, the information which is gained from study of the apparatuses may potentially be used in the design of land vehicles or space travel. This may be useful for space propulsion since the requirement for reactant to be carried with the rocket may potentially be reduced or eliminated. Moreover, since the apparatus could be made to produce thrust by just changing the direction of travel of any nearby dark matter, instead of increasing its velocity, the energy requirements of the apparatus may potentially be less than those of a standard rocket engine.

Figure 13:
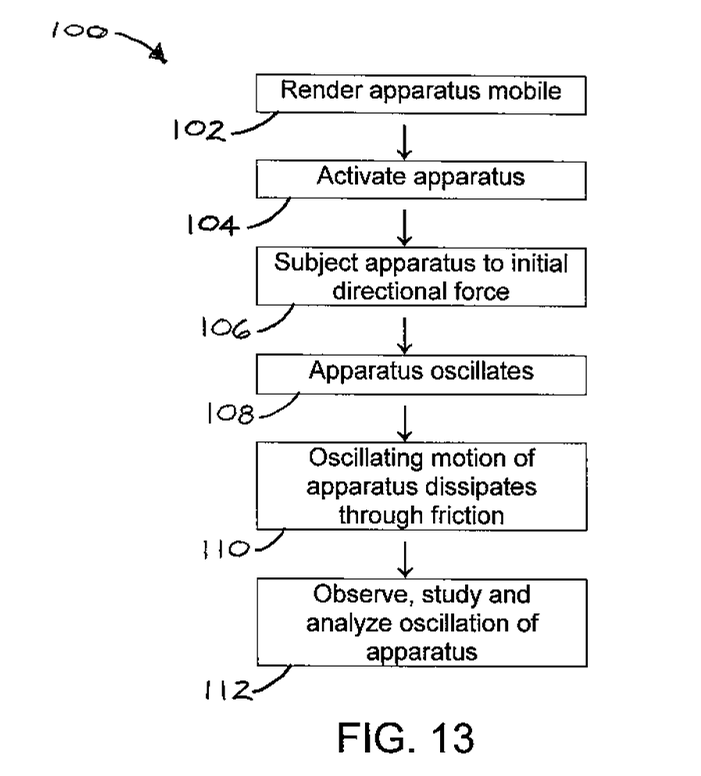
FIG. 13 is a flow diagram which illustrates an illustrative embodiment of the methods for studying possible effects of dark matter.

Referring next to FIG. 13 of the drawings, a flow diagram 100 which illustrates an illustrative embodiment of the methods for studying the possible effects of dark matter is illustrated. At Step 102, an apparatus may be rendered mobile according to the knowledge of those skilled in the art. The apparatus may have the same design as the apparatus 1 which was heretofore described with respect to FIGS. 1-4. At Step 104, the apparatus may be activated. In some applications, the apparatus may be placed on a float on water in a container, as was heretofore described with respect to FIGS. 5-8. At Step 106, the apparatus may be subjected to an initial directional force. At Step 108, the apparatus may oscillate about a fixed point between a first position and a second position under the influence of dark matter. At Step 110, the oscillating motion of the apparatus may dissipate through friction. At Step 112, the oscillating motion of the apparatus may be observed, studied and analyzed for the potential purpose of adaptation for a variety of applications.

Figure 14:
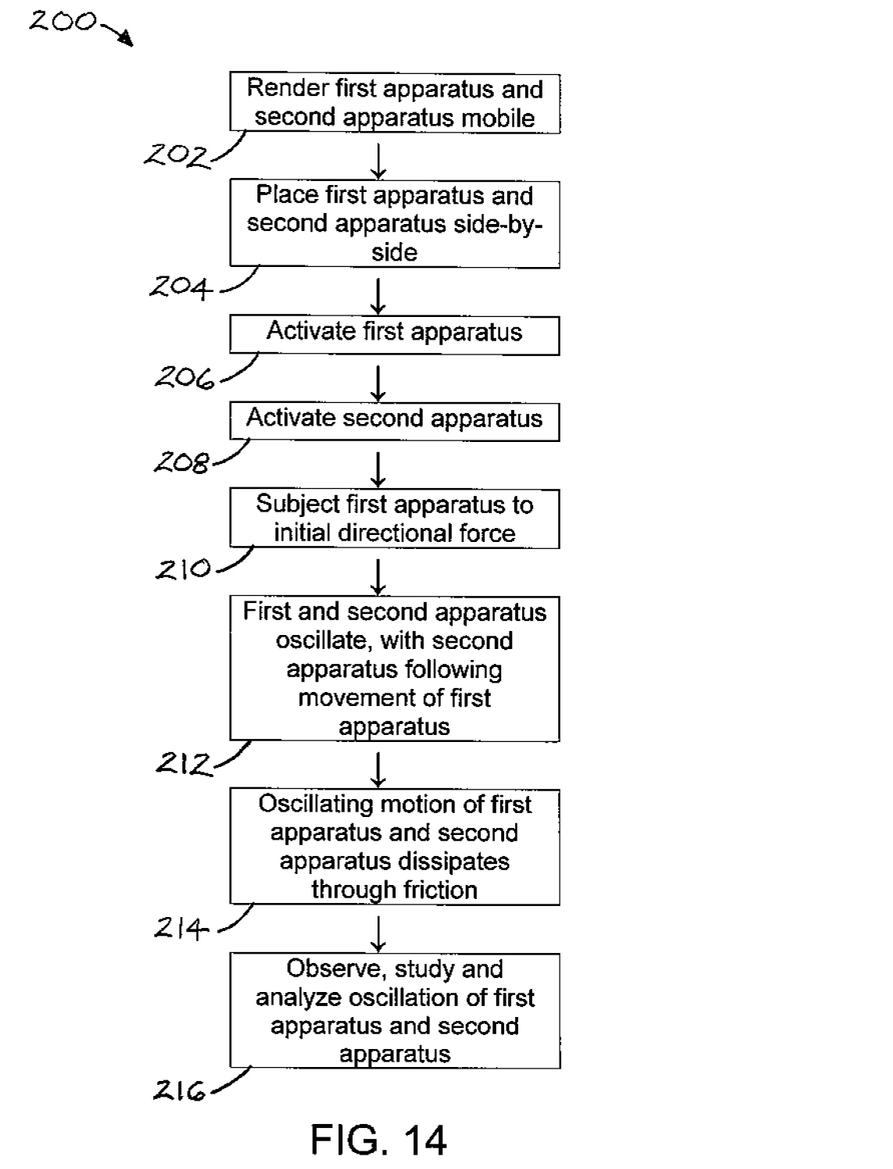
FIG. 14 is a flow diagram which illustrates another illustrative embodiment of the methods for studying possible effects of dark matter.

Referring next to FIG. 14 of the drawings, a flow diagram 200 which illustrates another illustrative embodiment of the methods for studying the possible effects of dark matter is illustrated. At Step 202, a first apparatus and a second apparatus may be rendered mobile according to the knowledge of those skilled in the art. In some applications, the first apparatus and the second apparatus may be placed on separate floats on water in separate containers which are placed side-by-side, as was heretofore described with respect to FIGS. 9-11. The first apparatus and the second apparatus may each have the same design as the apparatus 1 which was heretofore described with respect to FIGS. 1-4. At Step 204, the first apparatus and the second apparatus may be placed side-by-side. At Step 206, the first apparatus may be activated. At Step 208, the second apparatus may be activated. At Step 210, the first apparatus may be subjected to an initial directional force. At Step 212, the first apparatus and the second apparatus may oscillate under the influence of dark matter, with the second apparatus following the movement of the first apparatus. At Step 214, the oscillating motion of the first apparatus and the second apparatus may dissipate through friction. At Step 216, the oscillating motion of the apparatus may be observed, studied and analyzed for the potential purpose of adaptation for a variety of applications.

Figure 15:
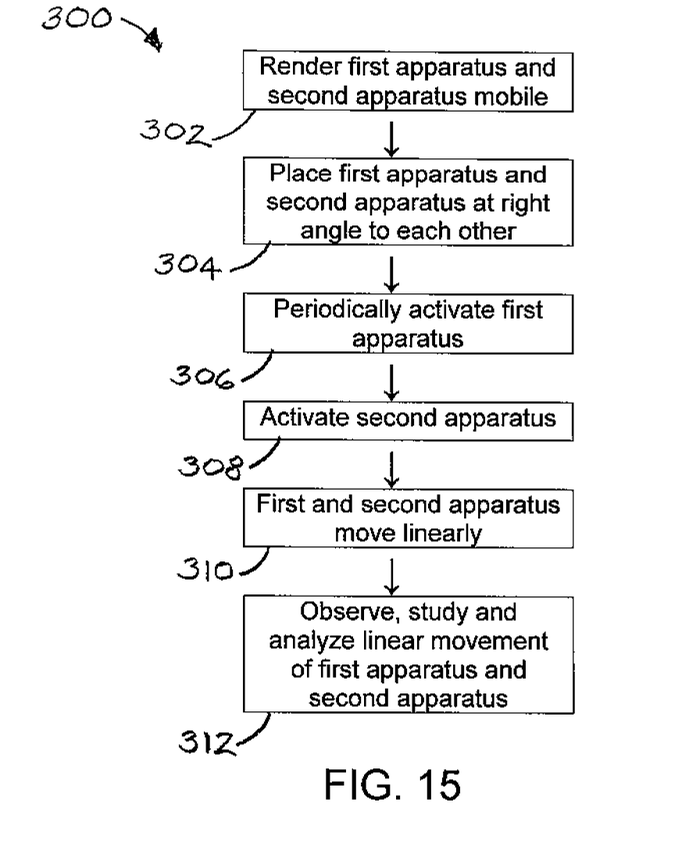
FIG. 15 is a flow diagram which illustrates still another illustrative embodiment of the methods for studying possible effects of dark matter.

Referring next to FIG. 15 of the drawings, a flow diagram 300 which illustrates still another illustrative embodiment of the methods for studying the possible effects of dark matter is illustrated. At Step 302, a first apparatus and a second apparatus may be rendered mobile according to the knowledge of those skilled in the art. In some applications, the first apparatus and the second apparatus may be placed on a float on water in a container, as was heretofore described with respect to FIG. 12. At Step 304, the first apparatus and the second apparatus may be placed at right angles to each other. At Step 306, the first apparatus may be periodically activated. At Step 308, the second apparatus may be activated. At Step 310, the first apparatus and the second apparatus may move under the influence of dark matter. At Step 312, the movement of the first apparatus and the second apparatus may be observed, studied and analyzed for the potential purpose of adaptation for a variety of applications.

While illustrative embodiments of the disclosure have been described above, it will be recognized and understood that various modifications can be made in the disclosure and the appended claims are intended to cover all such modifications which may fall within the spirit and scope of the disclosure.

What is claimed is:

1. An apparatus for studying possible effects of dark matter, comprising:
   an apparatus frame;
   an electronic oscillator supported by the apparatus frame;
   a power source supported by the apparatus frame in electrical communication with the electronic oscillator;
   a switch supported by the apparatus frame and disposed in electrical communication with the power source and the electronic oscillator;
   an antenna in series electrical communication with the electronic oscillator;
   a first diode in series electrical communication with the electronic oscillator and the antenna;
   a second diode in series electrical communication with the electronic oscillator and the antenna;

the first diode and the second diode ensure and restrict flow of electrical current in one direction only in the antenna.

2. The apparatus of claim 1 further comprising a buoyant float, and wherein the apparatus frame, the electronic oscillator, the power source, the antenna, the first diode and the second diode are supported by the float.

3. An apparatus for studying possible effects of dark matter, comprising:
an electronic oscillator including:
a Field Effect Transistor (FET) component; and
a source resistor/capacitor component;
a power source in electrical communication with the Field Effect Transistor component and the source resistor/capacitor component of the electronic oscillator;
a switch disposed in electrical communication with the power source and the electronic oscillator;
an antenna in series electrical communication with and between the Field Effect Transistor component and the source resistor/capacitor component;
a first diode in series electrical communication with and between the Field Effect Transistor component of the electronic oscillator and the antenna;
a second diode in series electrical communication with and between the source resistor/capacitor component of the electronic oscillator and the antenna;
the first diode and the second diode ensure and restrict flow of electrical current in one direction only in the antenna; and
an apparatus frame, and wherein the FET component and the source resistor/capacitor component of the electronic oscillator are supported at respective ends of the apparatus frame and the switch and the power source are supported by the apparatus frame between the FET component and the source resistor/capacitor component of the electronic oscillator.

4. The apparatus of claim 3 wherein the switch comprises a light-activated switch.

5. The apparatus of claim 3 further comprising at least one conductive reservoir disposed in electrical communication with the power source and the electronic oscillator.

6. The apparatus of claim 5 wherein the at least one conductive reservoir is disposed in spatial proximity to the source resistor/capacitor component of the electronic oscillator.

7. The apparatus of claim 3 further comprising a buoyant float, and wherein the electronic oscillator, the power source, the antenna, the first diode and the second diode are supported by the float.

8. The apparatus of claim 7 further comprising a container and water in the container, and wherein the float floats on the water.

9. An apparatus for studying possible effects of dark matter, comprising:
an antenna;
a first diode in series electrical communication with a first end of the antenna;
a second diode in series electrical communication with a second end of the antenna;
an electronic oscillator including:
a Field Effect Transistor (FET) component having
a Field Effect Transistor with a source, a drain and a gate, the source disposed in series electrical communication with the first diode;
a drain capacitor disposed in series electrical communication with the drain of the Field Effect Transistor;
a first coil disposed at a first end in series electrical communication with and between the source of the Field Effect Transistor and the first diode and at a second end in series electrical communication with the gate of the Field Effect Transistor; and
a second coil disposed at a first end in series electrical communication with and between the drain of the Field Effect Transistor the drain capacitor and at a second end in series electrical communication with and between the power source and the drain capacitor, the first coil and the second coil forming secondary and primary windings, respectively, of a transformer; and
a source resistor/capacitor component including a source resistor disposed in series electrical communication with the second diode and a source capacitor disposed in parallel electrical communication with the source resistor;
a power source disposed in series electrical communication with the source resistor and the source capacitor of the source resistor/capacitor component of the electronic oscillator; and
the first diode and the second diode ensure and restrict flow of electrical current in one direction only in the antenna.

10. The apparatus of claim 9 further comprising a switch disposed in, electrical communication with the power source and the electronic oscillator.

11. The apparatus of claim 10 wherein the switch comprises a light-activated switch.

12. The apparatus of claim 9 further comprising at least one conductive reservoir disposed in electrical communication with the power source and the electronic oscillator.

13. The apparatus of claim 12 wherein the at least one conductive reservoir is disposed in spatial proximity to the source resistor/capacitor component of the electronic oscillator.

14. The apparatus of claim 9 further comprising an apparatus frame, and wherein the FET component and the source resistor/capacitor component of the electronic oscillator are supported at respective ends of the apparatus frame and the switch and the power source are supported by the apparatus frame between the FET component and the source resistor/capacitor component of the electronic oscillator.

15. The apparatus of claim 9 further comprising a buoyant float, and wherein the electronic oscillator, the power source, the antenna, the first diode and the second diode are supported by the float.

16. The apparatus of claim 15 further comprising a container and water in the container, and wherein the float floats on the water.

17. A method for studying possible effects of dark matter, comprising:
rendering mobile at least one apparatus for studying possible effects of dark matter, the at least one apparatus including:
an electronic oscillator having;
a Field Effect Transistor component; and
a source resistor/capacitor component;
a power source in electrical communication with the Field Effect Transistor component and the source resistor/capacitor component of the electronic oscillator;
an antenna in series electrical communication with and between the Field Effect Transistor component and the source/resistor component;

a first diode in series electrical communication with and between the Field Effect Transistor component of the electronic oscillator and the antenna;

a second diode in series electrical communication with and between the source resistor/capacitor component of the electronic oscillator and the antenna; and the first diode and the second diode ensure and restrict flow of electrical current in one direction only in the antenna;

activating the at least one apparatus; and observing, studying and analyzing movement of the at least one apparatus.

18. The method of claim 17 further comprising subjecting the at least one apparatus to an initial directional force such that the at least one apparatus moves linearly.

19. The method of claim 17 wherein rendering mobile the at least one apparatus comprises providing a buoyant float, placing the at least one apparatus on the float, providing a container containing water and placing the float on the water.

20. The method of claim 17 wherein activating the apparatus comprises providing a light-activated switch in the apparatus and exposing the switch to light.

\* \* \* \* \*